(12) United States Patent
Sridevan

(10) Patent No.: US 6,727,128 B2
(45) Date of Patent: Apr. 27, 2004

(54) METHOD OF PREPARING POLYSILICON FET BUILT ON SILICON CARBIDE DIODE SUBSTRATE

(75) Inventor: Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/372,550

(22) Filed: Feb. 24, 2003

(65) Prior Publication Data

US 2003/0153118 A1 Aug. 14, 2003

Related U.S. Application Data

(62) Division of application No. 09/955,655, filed on Sep. 18, 2001, now Pat. No. 6,552,363.

(51) Int. Cl.$^7$ .......................................... H01L 21/8234
(52) U.S. Cl. ..................... 438/197; 438/590; 257/77
(58) Field of Search ............................ 438/268, 197, 438/590, 567, 779, 767; 257/77, 351, 168, 166, 329, 330

(56) References Cited

U.S. PATENT DOCUMENTS 6,303,947 B1 * 10/2001 Ueno ........................... 257/77
6,573,534 B1 * 6/2003 Kumar et al. .................. 257/77

* cited by examiner

Primary Examiner—Dung A. Le

(57) ABSTRACT

A polysilicon FET is built atop a SiC diode to form a MOSgated device. The polysilicon FET includes an invertible layer of polysilicon atop the surface of a SiC diode which has spaced diode diffusions. A MOSgate is formed on the polysilicon layer and the energization of the gate causes an inversion channel in the invertible layer to form a majority carrier conduction path from a top source electrode to a bottom drain electrode. Forward voltage is blocked in part by the polysilicon FET and in larger part by the depletion of the silicon carbide area between the spaced diode diffusions.

4 Claims, 2 Drawing Sheets

METHOD OF PREPARING POLYSILICON FET BUILT ON SILICON CARBIDE DIODE SUBSTRATE

RELATED APPLICATION

This is a divisional of U.S. patent application Ser. No. 09/955,655, filed Sep. 18, 2001 now U.S. Pat. No. 6,552,363 in the name of Srikant Sridevan and entitled POLYSILICON FET BUILT ON SILICON CARBIDE DIODE SUBSTRATE.

FIELD OF THE INVENTION

This invention relates to MOSgated devices and more specifically relates to a polysilicon MOSgated device build on a silicon carbide (SiC) diode substrate.

BACKGROUND OF THE INVENTION

Silicon carbide has many properties which are very desirable in MOSgated devices, for example, power JEFTs, MOSFETs, IGBTs, MOScontrolled thyristors and the like. For example, the very high band gap of SiC permits very high blocking voltage and its ability to operate at very high temperature permits the use of high current density. It is well known that single diffusions can be formed in an SiC substrate, but the diffusion time required is very long as compared to the time required to diffuse junctions into a monocrystalline silicon substrate. The formation of sequential diffused junctions of different conductivity types, as necessary for the formation of channel regions of one conductivity type and source regions of another type, are very difficult to form in an SiC substrate.

It would be very desirable to employ the desired characteristics of SiC for a MOSgated device without the need for the sequential formation of different conductivity type regions in the SiC substrate.

BRIEF DESCRIPTION OF THE INVENTION

In accordance with the present invention, a silicon FET (particularly polysilicon) is formed atop an SiC diode to define a MOSgated device with the desired thermal and voltage withstand characteristics of the SiC substrate, without requiring further diffusion into the SiC diode substrate. Thus, a lower polysilicon layer of the opposite conductivity type (which will contain the inversion region of the MOSgated device) to that of the substrate body is first deposited atop the surface of a SiC diode substrate having laterally spaced diode junctions diffused therein.

This layer is deposited undoped, and is implanted as with boron, to the desired resistivity. The top surface of this lower layer is then masked, and windows are formed to permit the implant of laterally spaced N$^+$ source regions overlying the positions of the SiC diodes, and an N$^+$ drain region located centrally between the SiC diode diffusions.

The top surface of the lower polysilicon layer is then oxidized to produce a silicon dioxide gate insulation layer having a thickness of, for example, 1000 Å. A conductive polysilicon gate layer (an upper poly layer) is then grown atop the gate oxide layer and is covered with an interlayer oxide.

The interlayer is photolithographically processed to open windows to enable contact to the N$^+$ source regions in the lower polysilicon layer and thus to the diode diffusions in the SiC. An inversion layer is formed in the lower undoped polysilicon layer between the N$^+$ source and N$^+$ drain regions and the gate oxide interface.

The forward blocking voltage is then supported primarily by the depletion of the SiC drain between the spaced diode junctions, and only a small portion of the voltage is held off by the polysilicon FET. The device conducts in the usual manner of a MOSFET.

DETAILED DESCRIPTION OF THE DRAWINGS

Figure 1:
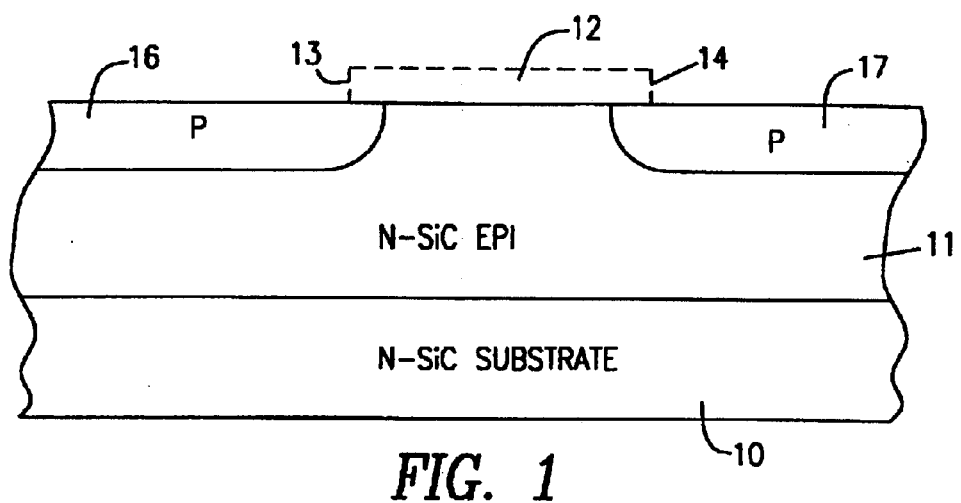
FIG. 1 is a cross-section of a small portion of a silicon carbide wafer after spaced diode junctions are diffused thereon.

Referring first to FIG. 1, there is shown a silicon carbide substrate 10 having an epitaxially deposited layer 11 thereon. Both are shown as N type for an N channel device, and would be P for a P channel device. Substrate 10 can have a thickness of 200 microns and a resistivity of about 0.010 ohm cm. The epi layer 11 will have a thickness and resistivity related to the device blocking voltage. Thus, for a device with a forward blocking voltage of 600 volts, epi layer 11 will have a thickness of about 10 microns and a resistivity of about 1 ohm cm.

The surface of N$^-$ layer 11 is masked by a suitable photoresist 12 or other suitable mask such as an oxide which can withstand the high in-situ implant temperature which may be required to reduce damage and increase the dopant activation in the implant region which is photolithographically processed to define implant windows, shown partially as windows 13 and 14 in FIG. 1. The windows may be spaced stripes or may be polygonal in shape. Alternatively, they can extend around the device surface in "race track" form. The windows can also be the windows of a grid.

A plurality of spaced P type diode diffusions, for example, diffusions 16 and 17 are then formed in the SiC layer 11 as by an implant through windows 13 and 14 and a high temperature diffusion. Diffusions 16 and 17 may be about 1.5 microns deep and spaced by about 1.5 microns. They may form a grid or be otherwise connected at a plurality of locations, and, where spaced, are spaced by a given gap.

Figure 2:
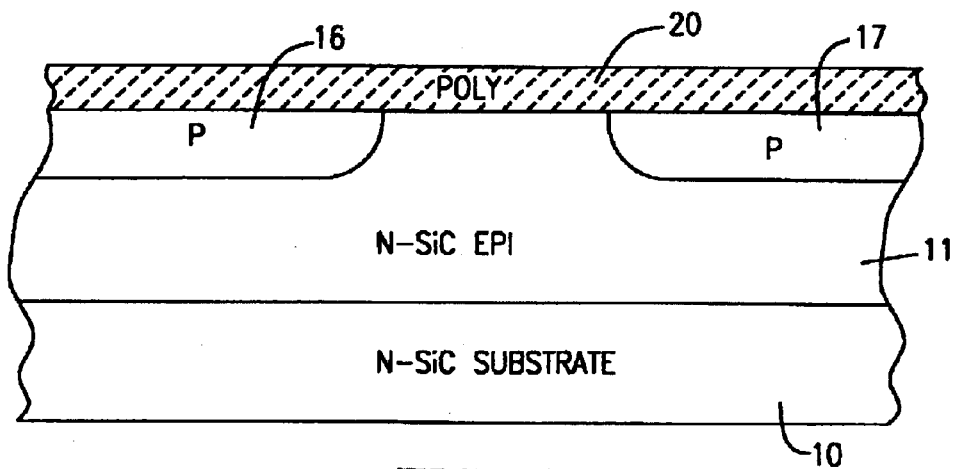
FIG. 2 shows the structure of FIG. 1 after the formation of a lower polycrystalline silicon layer on its top surface.

Thereafter and as shown in FIG. 2 a non-SiC MOSFET is built atop the surface of layer 11. Thus, in a preferred embodiment, a polysilicon layer 20 is first deposited atop layer 11 to a thickness, for example, of 1.0 microns. Layer 20 could be of any other material (non-SiC) such as epitaxially deposited monocrystaline silicon. Layer 20 is then implanted with boron to a resistivity of 0.01 to 1 ohm cm. This P$^-$ layer 20 is sometimes referred to as the lower polysilicon layer.

Figure 3:
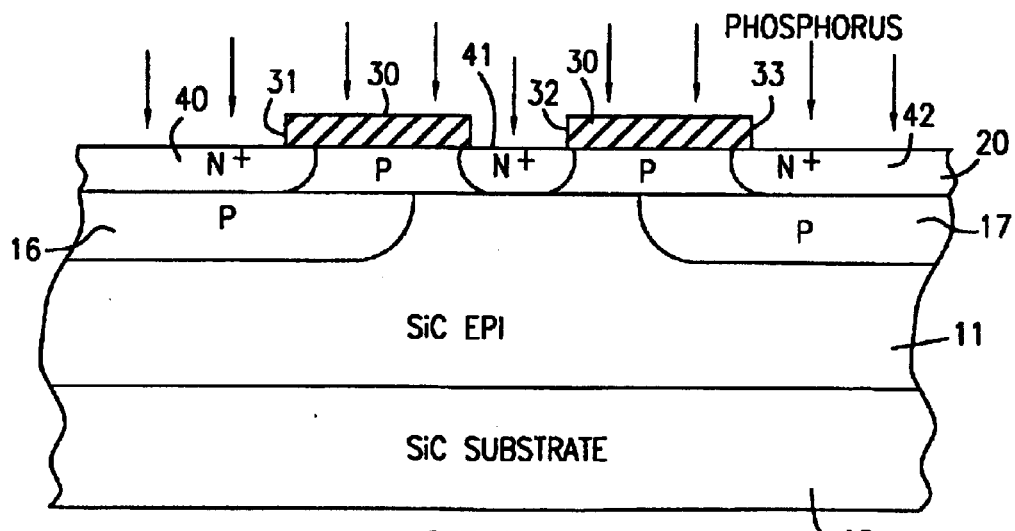
FIG. 3 shows the structure of FIG. 2 after the function of the source and drain regions of a polysilicon MOSFET.

Thereafter, and as shown in FIG. 3, the top of layer 20 receives a photoresist 30 which is photolithographically processed to form windows 31, 32 and 33. A phosphorus or arsenic implant is then carried out followed by a diffusion to produce N$^+$ source regions 40, 42 and N$^+$ drain region 41, which contact P region 16, P region 17, and layer 11, respectively.

Figure 4:
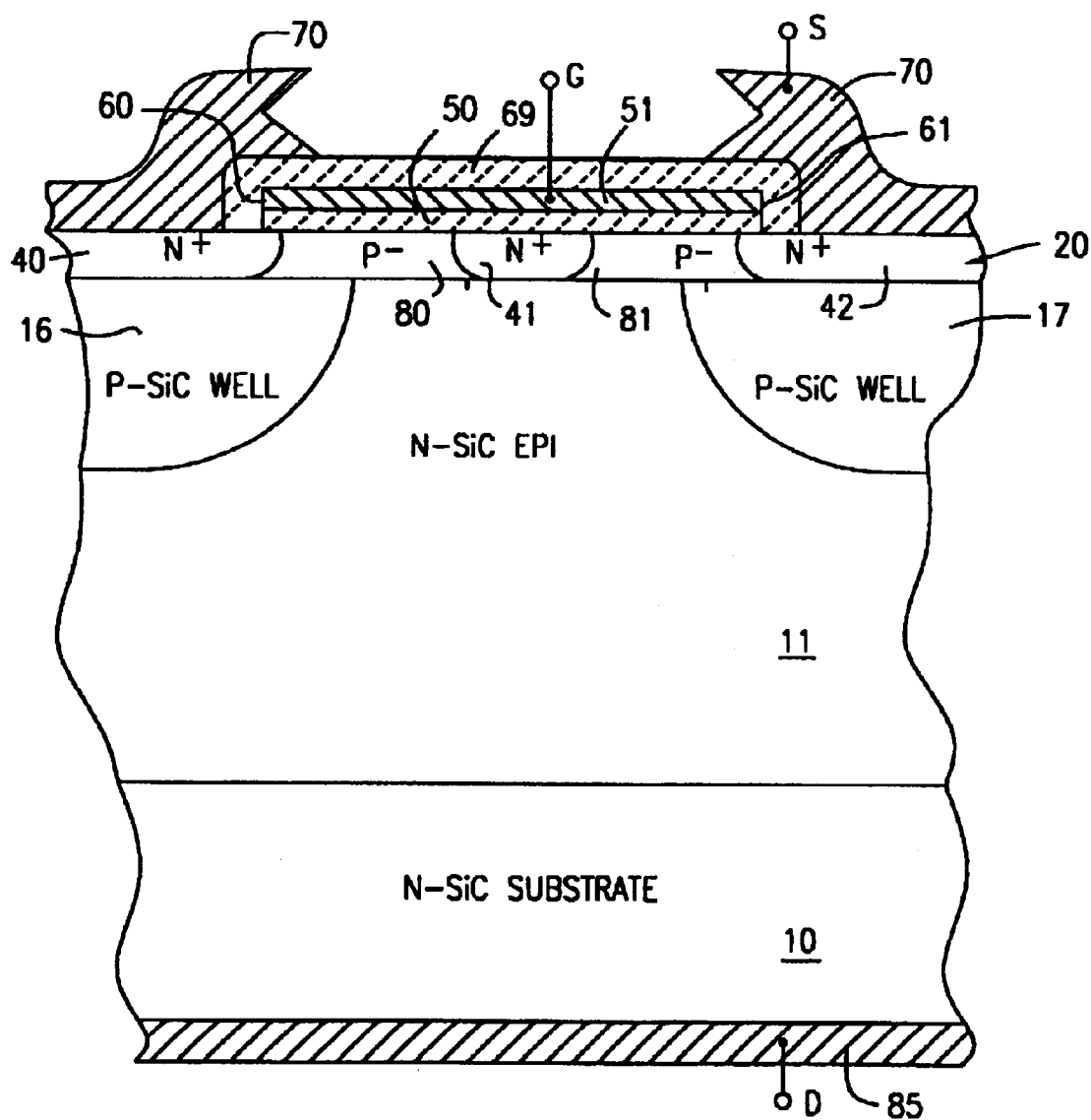
FIG. 4 shows the structure of FIG. 3 after the completion of the polysilicon MOSFET.

As next shown in FIG. 4, a gate oxide layer 50 is grown atop lower polysilicon layer 20 to a thickness, for example, of 1000 Å. A second and conductive gate polysilicon layer 51 is deposited atop gate oxide 50 and, in a next mask step, windows 60, 61 are opened in layers 50 and 51. A low temperature oxide layer 69 is then grown over and around conductive gate 51, and is patterned, and a source electrode 70, for example, an aluminum electrode, is formed as by sputtering over the upper device surface and in contact with source regions 40, 42.

Thus, a polysilicon MOSFET (lateral conduction) has been formed atop the upper surface of SiC layer 11, consisting of source regions 42, and invertible P$^-$ channel regions 80 and 81 beneath gate oxide 50 and invertible by gate voltage applied to gate 51. A drain electrode 85 is applied to the bottom of substrates.

Note that the MOSFET can be formed in structures other than polysilicon, and can, for example, employ an epitaxially deposited layer of monocrystalline silicon in place of layer 20.

The device of FIG. 4 operates as follows: In the off state, with drain 85 positively biased, a reverse voltage appears across the P/N junction of the diffusions 16, 17 to N layer 11 and in the SiC. The P wells 16 and 17 are designed so that the space between them is depleted out at from about 10 to about 50 volts. The polysilicon MOSFET therefore need only support up to about 50 volts and the remainder of the forward blocking voltage is supported in the SiC layer 11.

In the on state, when the conductive gate 51 is positively biased with reference to the source 70 an inversion region is formed in the polysilicon regions 80, 81 below the gate 51. Current flows in this region and enters the SiC layer 11 in between the adjacent wells 16, 17 from the region 41 in the polysilicon layer 20 that is doped N$^+$-type. This N$^+$ region 41 permits current to flow from the poly layer 20 to the SiC layer 11, acting as a contact to the SiC layer 11. The current then flows to the bottom drain electrode 85.

The direction of current flow is reversed if all conductivity regions are reversed.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. The process for manufacture of metal oxide semiconductor gated (MOSgated) device comprising the formation of spaced diffusions in the top surface of a silicon carbide (SiC) substrate; forming a layer of polysilicon over said top surface; forming a MOSgate structure in said layer of polysilicon and aligned over the space between said diffusions; and forming a source electrode connected to said spaced diffusions.

2. The process of claim 1, which includes a first mask step for defining said MOSgate structure and a second mask step for defining the connection of said source electrode to said spaced diffusions.

3. The process of claim 1, wherein said MOSgate structure includes a layer of gate insulation formed atop said polysilicon layer, and a gate electrode layer formed atop said gate insulation layer.

4. The process of claim 2, wherein said MOSgate structure includes a layer of gate insulation formed atop said polysilicon layer, and a gate electrode layer formed atop said gate insulation layer.

* * * * *